United States Patent [19]

Partyka

[11] Patent Number: 5,659,580
[45] Date of Patent: Aug. 19, 1997

[54] DATA INTERLEAVER FOR USE WITH MOBILE COMMUNICATION SYSTEMS AND HAVING A CONTIGUOUS COUNTER AND AN ADDRESS TWISTER

[75] Inventor: Andrzej F. Partyka, Bedminster, N.J.

[73] Assignee: Lucent Technologies Inc., Murray Hill, N.J.

[21] Appl. No.: 346,442

[22] Filed: Nov. 29, 1994

[51] Int. Cl.$^6$ ............................................. H04L 25/49
[52] U.S. Cl. ............... 375/295; 395/421.01; 395/421.1; 395/421.07; 395/405; 455/38.1; 365/89.02; 364/966.3
[58] Field of Search ..................... 375/295, 284, 375/285, 286; 385/416, 421.07, 421.08, 421.09, 421.1, 412, 405; 455/38.1; 391/37.5, 40.1; 370/18, 19; 340/825.52, 825.53, 825.65, 825.68; 364/966.3; 365/189.02

[56] References Cited

U.S. PATENT DOCUMENTS

| | | | |
|---|---|---|---|
| 4,760,587 | 7/1988 | Ehlinger et al. | 375/295 |
| 4,866,717 | 9/1989 | Murai et al. | 371/40.3 |
| 4,961,204 | 10/1990 | Tanaka et al. | 375/242 |
| 5,029,185 | 7/1991 | Wei | 375/295 |
| 5,051,998 | 9/1991 | Murai et al. | 371/39.1 |
| 5,206,851 | 4/1993 | Cho | 369/48 |

Primary Examiner—Wellington Chin
Assistant Examiner—William Luther

[57] ABSTRACT

The present invention includes a data buffer, a contiguous counter and an address twister. The contiguous counter generates a contiguous sequence of addresses which are used to load data into the data buffer in a contiguous order. The address twister generates a non-contiguous sequence of addresses which corresponds to an interleaving sequence. The non-contiguous addresses output the encoded data from the data buffer in the order specified by the interleaving sequence.

9 Claims, 5 Drawing Sheets

FIG. 4
PRIOR ART

| 0 | 8 | 4 | 12 | 2 | 10 | 6 | 14 | 1 | 9 | 5 | 13 | 3 | 11 | 7 | 15 |
|---|---|---|----|---|----|---|----|---|---|---|----|---|----|---|----|
| 64 | 72 | 68 | 76 | 66 | 74 | 70 | 78 | 65 | 73 | 69 | 77 | 67 | 75 | 71 | 79 |
| 128 | 136 | 132 | 140 | 130 | 138 | 134 | 142 | 129 | 137 | 133 | 141 | 131 | 139 | 135 | 143 |
| 192 | 200 | 196 | 204 | 194 | 202 | 198 | 206 | 193 | 201 | 197 | 205 | 195 | 203 | 199 | 207 |
| 256 | 264 | 260 | 268 | 258 | 266 | 262 | 270 | 257 | 265 | 261 | 269 | 259 | 267 | 263 | 271 |
| 320 | 328 | 324 | 332 | 322 | 330 | 326 | 334 | 321 | 329 | 325 | 333 | 323 | 331 | 327 | 335 |
| 32 | 40 | 36 | 44 | 34 | 42 | 38 | 46 | 33 | 41 | 37 | 45 | 35 | 43 | 39 | 47 |
| 96 | 104 | 100 | 108 | 98 | 106 | 102 | 110 | 97 | 105 | 101 | 109 | 99 | 107 | 103 | 111 |
| 160 | 168 | 164 | 172 | 162 | 170 | 166 | 174 | 161 | 169 | 165 | 173 | 163 | 171 | 167 | 175 |
| 224 | 232 | 228 | 236 | 226 | 234 | 230 | 238 | 225 | 233 | 229 | 237 | 227 | 235 | 231 | 239 |
| 288 | 296 | 292 | 300 | 290 | 298 | 294 | 302 | 289 | 297 | 293 | 301 | 291 | 299 | 295 | 303 |
| 352 | 360 | 356 | 364 | 354 | 362 | 358 | 366 | 353 | 361 | 357 | 365 | 355 | 363 | 359 | 367 |
| 16 | 24 | 20 | 28 | 18 | 26 | 22 | 30 | 17 | 25 | 21 | 29 | 19 | 27 | 23 | 31 |
| 80 | 88 | 84 | 92 | 82 | 90 | 86 | 94 | 81 | 89 | 85 | 93 | 83 | 91 | 87 | 95 |
| 144 | 152 | 148 | 156 | 146 | 154 | 150 | 158 | 145 | 153 | 149 | 157 | 147 | 155 | 151 | 159 |
| 208 | 216 | 212 | 220 | 210 | 218 | 214 | 222 | 209 | 217 | 213 | 221 | 211 | 219 | 215 | 223 |
| 272 | 280 | 276 | 284 | 274 | 282 | 278 | 286 | 273 | 281 | 277 | 285 | 275 | 283 | 279 | 287 |
| 336 | 344 | 340 | 348 | 338 | 346 | 342 | 350 | 337 | 345 | 341 | 349 | 339 | 347 | 343 | 351 |
| 48 | 56 | 52 | 60 | 50 | 58 | 54 | 62 | 49 | 57 | 53 | 61 | 51 | 59 | 55 | 63 |
| 112 | 120 | 116 | 124 | 114 | 122 | 118 | 126 | 113 | 121 | 117 | 125 | 115 | 123 | 119 | 127 |
| 176 | 184 | 180 | 188 | 178 | 186 | 182 | 190 | 177 | 185 | 181 | 189 | 179 | 187 | 183 | 191 |
| 240 | 248 | 244 | 252 | 242 | 250 | 246 | 254 | 241 | 249 | 245 | 253 | 243 | 251 | 247 | 255 |
| 304 | 312 | 308 | 316 | 306 | 314 | 310 | 318 | 305 | 313 | 309 | 317 | 307 | 315 | 311 | 319 |
| 368 | 376 | 372 | 380 | 370 | 378 | 374 | 382 | 369 | 377 | 373 | 381 | 371 | 379 | 375 | 383 |

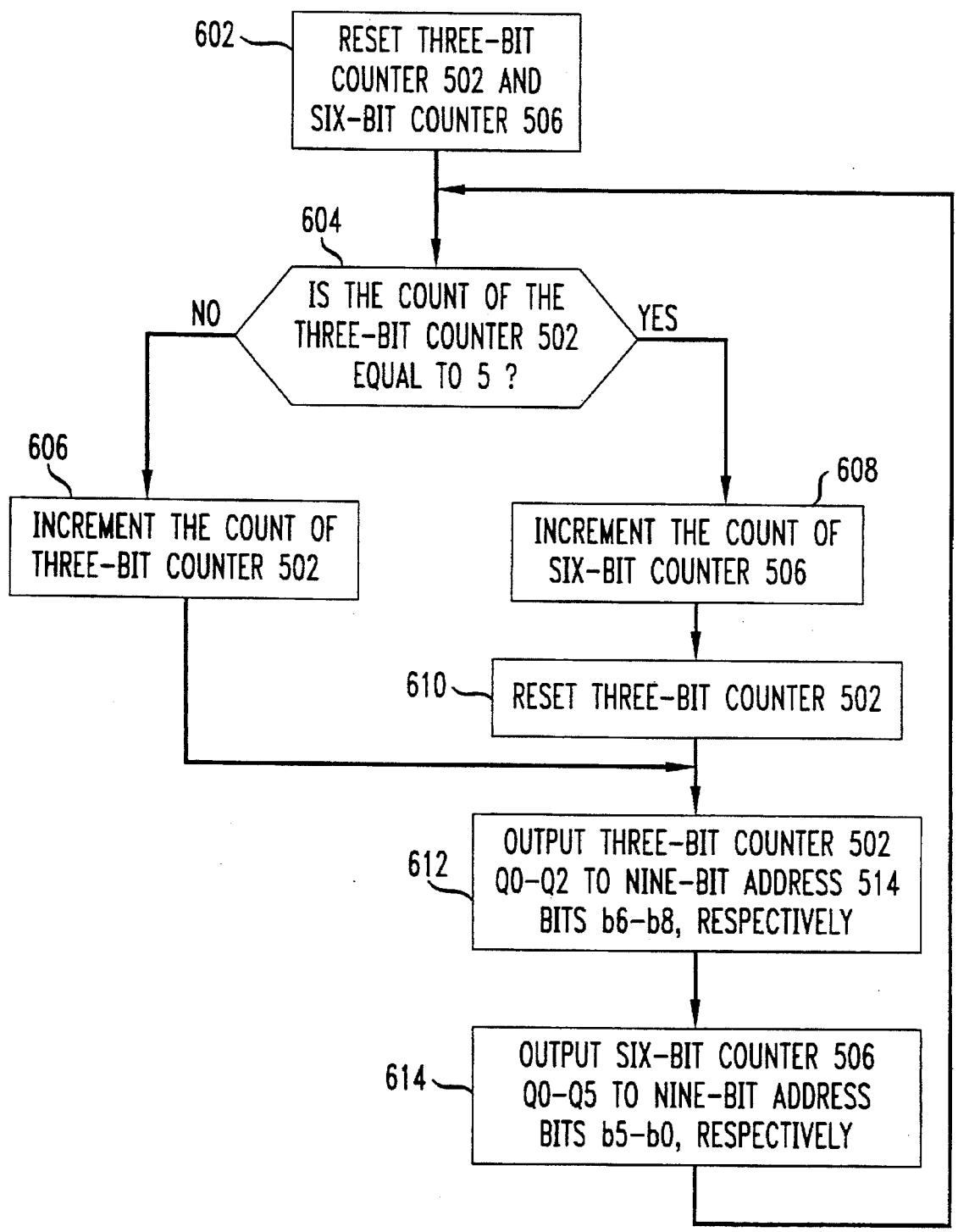

DATA INTERLEAVER FOR USE WITH MOBILE COMMUNICATION SYSTEMS AND HAVING A CONTIGUOUS COUNTER AND AN ADDRESS TWISTER

BACKGROUND OF THE INVENTION

1. Field of the Invention

The present invention relates generally to interleaver circuits and methods of interleaving data. More particularly, the present invention is directed to an interleaver circuit as required for the North American Code Division Multiple Access (CDMA) terminal according to the IS95 standard.

2. Related Art

The IS95 standard is a mobile telecommunication standard which employs Code Division Multiple Access (CDMA). CDMA is a form of modulation in which digital information is encoded in an expanded bandwidth format. In CDMA, several transmissions occur simultaneously within the same bandwidth. Mutual interference can be reduced by the degree of orthogonality of the unique codes used in each transmission. CDMA permits a high degree of energy dispersion in the emitted bandwidth.

In a mobile telecommunication environment, signal strength varies with location and movement of the mobile transmitter/receiver. Signal strength can significantly affect error rates which in turn effect the quality of communication. Due to varying signal strength, mobile telecommunication systems are susceptible to burst errors. Burst errors are groupings of errors that occur in adjacent bits of a data block as compared to errors that are dispersed over a whole block of data. The IS95 standard addresses the problem of varying signal strength and burst errors by utilizing an error correction scheme based on encoding and interleaving.

Generally, interleaving is used in conjunction with encoding (e.g., error-correcting codes) in order to lower the error rates of communication channels that are susceptible to burst errors. Interleaving is a technique in which encoded digital data is reordered before transmission in such a manner that any two successive digital data bits in the original data stream are separated by a predetermined distance in the transmitted data stream. Deinterleaving is the reverse of interleaving where data bits are reordered back to their original positions. By re-ordering the data, interleaving disperses, or randomizes, burst errors throughout the data block which improves the error-correcting capability of an encoding scheme.

According to the IS95 standard, data is encoded and interleaved prior to transmission and decoded and deinterleaved after reception. A convolutional encoder in the transmitter encodes a data block. An interleaver in the transmitter then interleaves the encoded data according to the IS95 interleaving sequence. The interleaved data is transmitted to a receiver. The receiver deinterleaves and decodes the received data. Such deinterleaving disperses burst errors, which can occur during transmission, throughout the data block. This dispersal of bit errors maximizes the capability of the decoder to correct the errors. Thus, the interleaving process is an essential part of the error protection scheme adopted by the IS95 standard.

In a mobile telecommunication system it is important to minimize chip size and current consumption. This is particularly true in the mobile stations, such as cellular telephones. Chip cost is proportional to chip size. Additionally, the more current a mobile device uses, the shorter the battery life. Thus, it is a goal in mobile telecommunication systems to reduce both chip area and current consumption.

The IS95 standard defines a formula for computing interleaving addresses. Computation of interleaving addresses using the formula defined in the IS95 standard, at the required bit rate of 19 kbs (kilobits per second), requires several MIPS (million instructions per second) of processing capability. The circuitry necessary to provide several MIPS of processing requires a significant amount of chip area and consumes a significant amount of current.

Another conventional method for computing interleaving addresses uses a look-up table to determine the proper interleaving address. This method minimizes the processing capability required to generate interleaving addresses. However, the look-up table requires a significant amount of memory. This memory space requires a significant amount of chip area to implement.

Thus, conventional implementations of mobile telecommunication systems are flawed because they utilize interleaver circuits which require a significant amount of chip area and draw a significant amount of current.

SUMMARY OF THE INVENTION

The present invention is an efficient interleaver circuit which overcomes the problems of chip area and current consumption of conventional interleaver circuits. In the present invention, the interleaver circuit is preferably implemented using a data buffer, two counters and a multiplexer. The simplicity of this circuit reduces the chip area and current consumption required to implement the interleaver circuit. Furthermore, the simplicity of the present invention increases the reliability and the speed of the interleaver circuit.

The present invention is part of a mobile telecommunications system which interleaves encoded data prior to transmission. The present invention includes a data buffer, a contiguous counter and an address twister. The contiguous counter generates a contiguous sequence of addresses which are used to load encoded data into the data buffer in a contiguous order. The address twister, a non-contiguous counter, generates a non-contiguous sequence of addresses which corresponds to an interleaving sequence. The non-contiguous addresses output the encoded data from the data buffer in the order specified by the interleaving sequence.

In a preferred embodiment of the present invention, the address twister generates the interleaving sequence specified by the IS95 standard. The address twister includes two counters: a three-bit modulo-six counter and a six-bit modulo-64 counter.

The foregoing and other features and advantages of the invention will be apparent from the following, more particular description of a preferred embodiment of the invention, as illustrated in the accompanying drawings.

BRIEF DESCRIPTION OF THE DRAWINGS

FIG. 4 illustrates an interleaving sequence defined by the IS95 standard. To obtain the interleaving sequence, the table is read by columns, i.e. column 1 first then column 2, etc.

FIG. 6 is a flow diagram illustrating the operation of the address twister of FIG. 5.

DETAILED DESCRIPTION OF THE PREFERRED EMBODIMENT

The preferred embodiment of the invention is discussed in detail below. While specific part numbers and configurations are discussed, it should be understood that this is done for illustration purposes only. A person skilled in the relevant art will recognize that other components and configurations may be used without departing from the spirit and scope of the invention.

The preferred embodiment of the invention is now described with reference to the figures where like reference numbers indicate like elements. In addition, the left-most digit of each reference number indicates the figure in which the number is first used.

Figure 1:
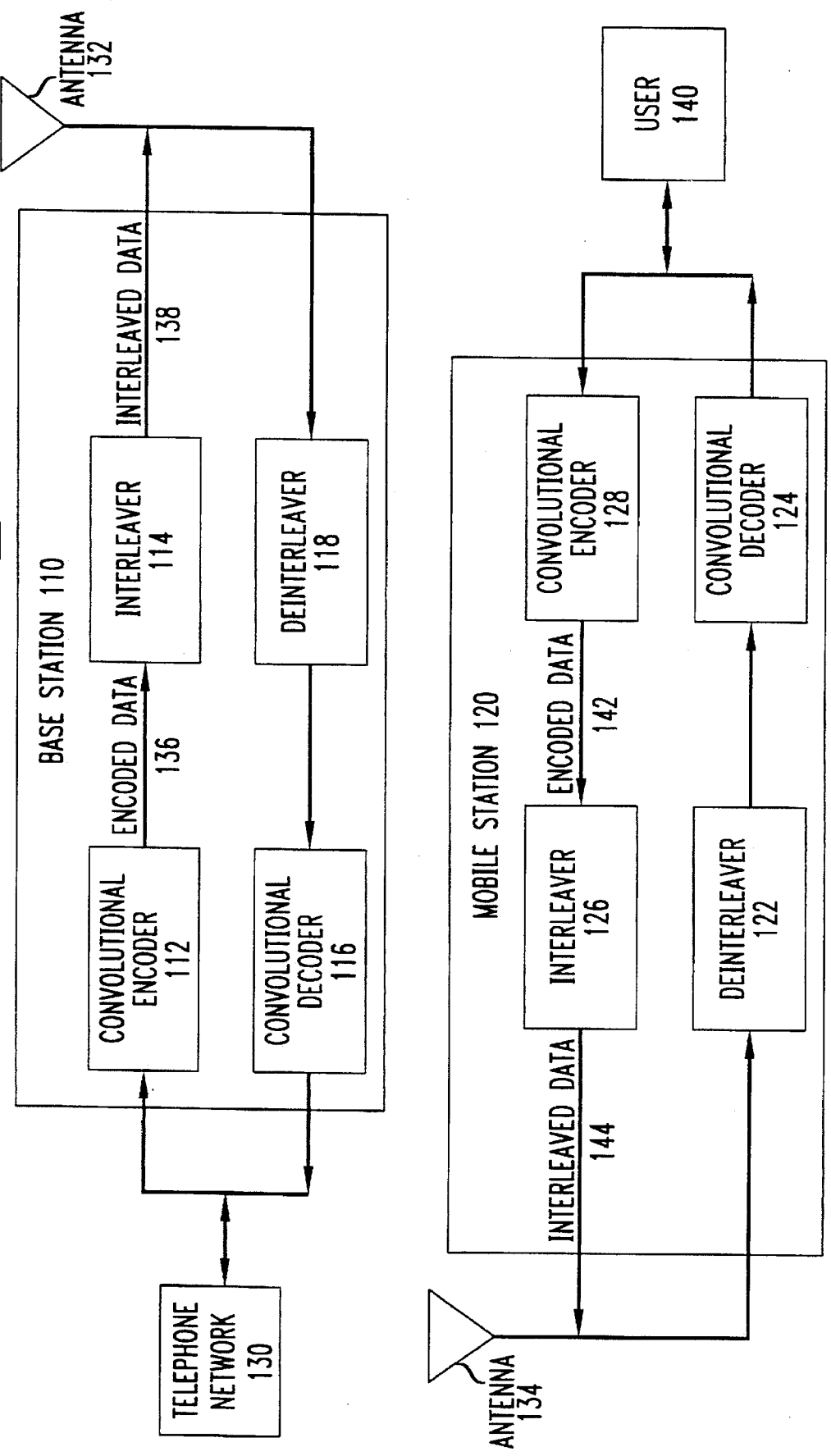
FIG. 1 is a block diagram of a mobile telecommunication system.

FIG. 1 is a block diagram of a mobile telecommunication system 100. Mobile telecommunication system 100 includes a base station 110 and one or more mobile stations 120. Base station 110 includes a convolutional encoder 112, an interleaver 114, a deinterleaver 118 and a convolutional decoder 116. Mobile station 120 includes a convolutional encoder 128, an interleaver 126, a deinterleaver 122 and a convolutional decoder 124.

Base station 110 and mobile station 120 communicate with each other as follows. Base station 110 receives data from a telephone network 130. The network data is processed and then encoded by convolutional encoder 112 in a well-known manner according to an encoding standard, such as IS95. Encoded data 136 is interleaved by interleaver 114. The interleaving sequence is consistent with a standard, such as IS95 (interleaving is discussed in detail below). Interleaving provides protection against burst errors by spreading out, or randomizing, errors that occur in short bursts of time. Base station 110 transmits interleaved data 138 to mobile station 120 via an antenna 132. Mobile station 120 receives the transmitted data via an antenna 134. The received data is deinterleaved by deinterleaver 122 and decoded by convolutional decoder 124. The decoded and deinterleaved data is output to a user 140.

Transmission from mobile station 120 to base station 110 occurs in a similar manner. Mobile station 120 receives data from a user 140. The data is encoded by convolutional encoder 128 in a well-known manner according to an encoding standard, such as IS95. Encoded data 142 is interleaved by interleaver 126. The interleaving sequence is consistent with a standard, such as IS95. Interleaved data 144 is transmitted to base station 110 via antenna 134. Base station 110 receives the transmitted data via antenna 132. The received data is deinterleaved by deinterleaver 118 and decoded by convolutional decoder 116. The decoded and interleaved data is output to telephone network 130.

The interleaving process reorders the data bits such that successive data bits are spread throughout the data block. During transmission, errors which corrupt data bits tend to occur in bursts, i.e., corrupt groups of adjacent bits. When the interleaved data is deinterleaved adjacent bit errors will be dispersed throughout the data block. This maximizes the data encoding scheme's capability to correct the bit errors.

Figure 2:
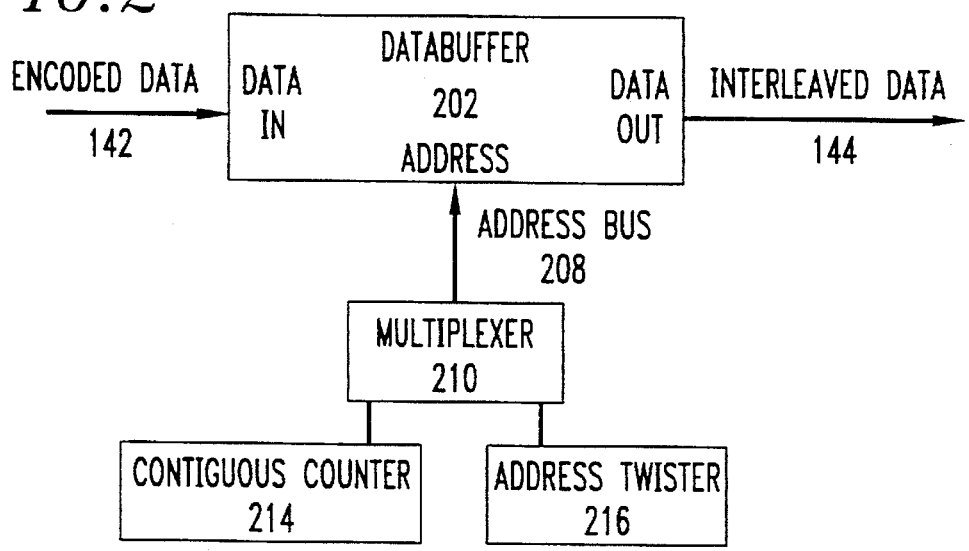
FIG. 2 is a block diagram of an interleaver circuit in accordance with a preferred embodiment of the present invention.

FIG. 2 is a block diagram of interleaver 114 according to a preferred embodiment of the present invention. Interleaver 114 includes a data buffer 202, a multiplexer 210, a contiguous counter 214 and address twister 216.

Multiplexer 210 connects contiguous counter 214 to address bus 208 of data buffer 202. Encoded data 142 is loaded into data buffer 202 at contiguous addresses generated by contiguous counter 214. In other words, encoded data 142 is stored in contiguous order in data buffer 202, i.e., bit 0 of encoded data stream 142 is stored in the first bit address location in data buffer 202, bit 1 of the encoded data stream 142 is stored in the second bit address location, bit 2 of the encoded data stream 142 is stored in the third bit address location, etc.

After encoded data 142 is completely stored in data buffer 202, multiplexer 210 connects address twister 216 to address bus 208 of data buffer 202. Address twister 216 is a state machine which generates a noncontiguous sequence of addresses which corresponds to an interleaving sequence. Thus, encoded data 142 is output from data buffer 202 in an order defined by the interleaving sequence generated by address twister 216. In other words, the interleaving sequence generated by address twister 216 is used to address data buffer 202 as encoded data 142 is output from data buffer 202. Thus, data is output from data buffer 202 in a sequence that corresponds to the interleaving sequence generated by address twister 216.

Alternately, the present invention could operate as follows. Address twister 216 is connected to address bus 208 when data is loaded into data buffer 202 and contiguous counter 214 is connected to address bus 208 when data is output from data buffer 202.

Figure 3:
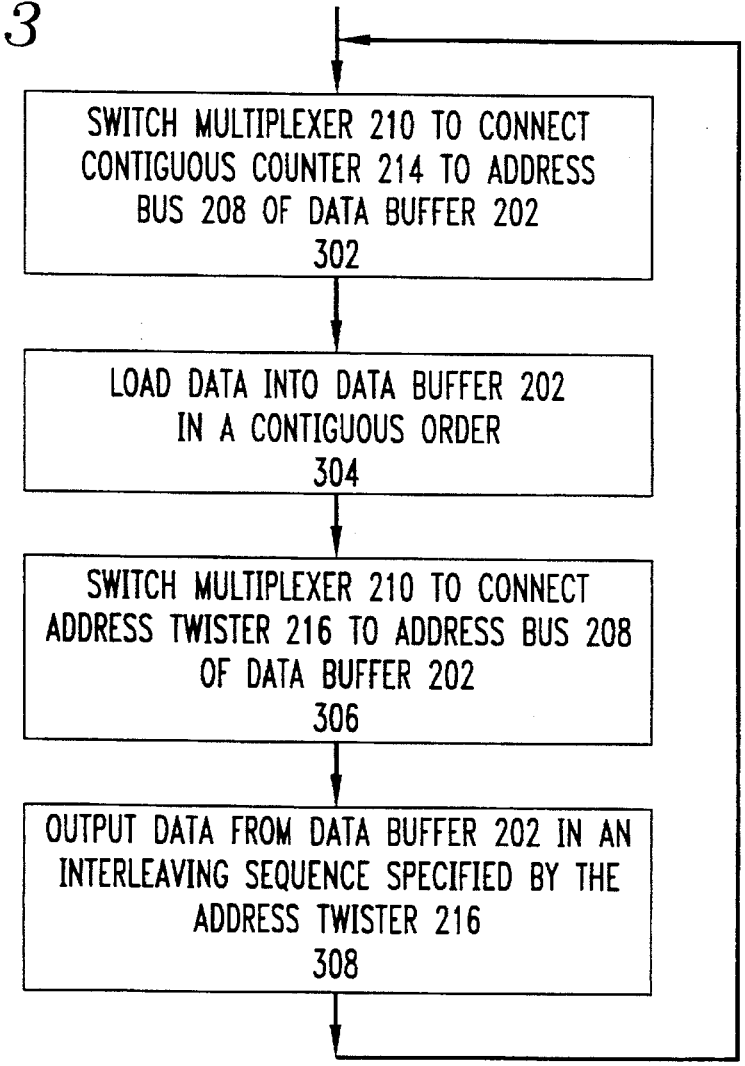
FIG. 3 is a flow diagram illustrating the operation of the interleaver circuit of FIG. 2.

FIG. 3 illustrates the operation of the above described interleaver circuit 114. In a step 302, multiplexer 210 connects contiguous counter 214 to address bus 208 of data buffer 202. In a step 304, encoded data 142 is loaded in a contiguous order into data buffer 202 according to a sequence of contiguous addresses generated by contiguous counter 214. In a step 306, multiplexer 210 is switched to connect address twister 216 to address bus 208. In a step 308, data is output from data buffer 202 in the interleaving sequence defined by non-contiguous addresses generated by address twister 216.

FIG. 4 illustrates the IS95 interleaving sequence. As defined by the IS95 standard, data is interleaved in blocks of 384 bits each. The interleaving sequence begins at the top left-hand corner and proceeds down the first column. The interleaving sequence continues at the top of the second column (moving from left to right) and proceeds down the second column, then down the third column, etc. Thus, the IS95 interleaving sequence is 0, 64, 128, 192, 256, etc. For example, the first data bit in an interleaved data block, according to the IS95 standard, is bit 0. The second data bit in the interleaved data block is bit 64. The third data bit is bit 128. The twenty-fourth data bit is bit 368. The twenty-fifth data bit is bit 8. The forty-eighth data bit is bit 376. The forty-ninth data bit is bit 4, etc.

In a preferred embodiment of the present invention, address twister 216 generates non-contiguous addresses in the sequence defined by the IS95 standard as shown in FIG. 4. Therefore, data is read from data buffer 202 in the IS95 interleaving sequence. In other words, the non-contiguous addresses generated by address twister 216 (such non-contiguous addresses representing the interleaving sequence) are as follows: 0, 64, 128, 192, 256, etc.

Figure 5:
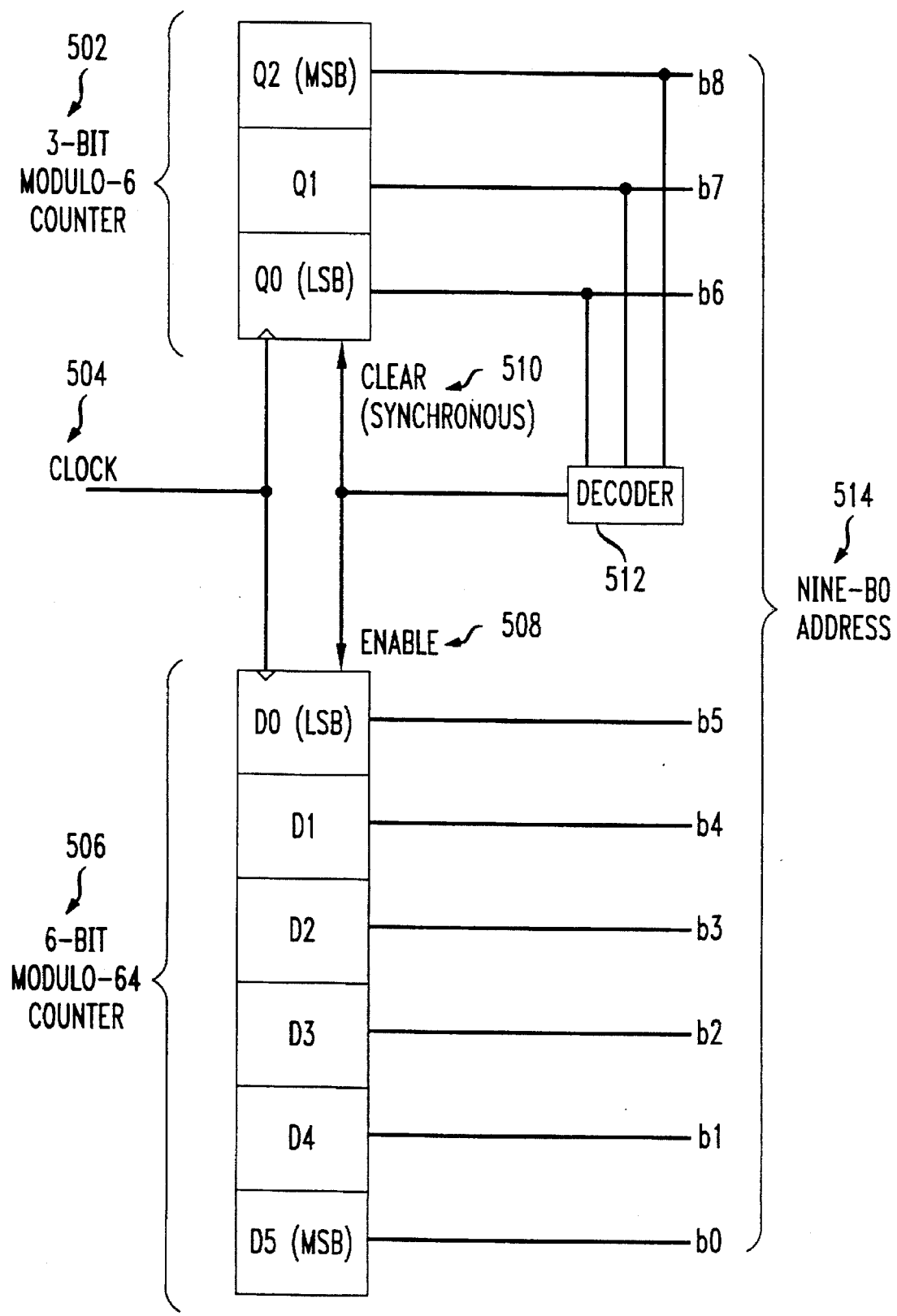
FIG. 5 schematically illustrates an address twister which generates the IS95 interleaving sequence in accordance with a preferred embodiment of the present invention.

FIG. 5 is a block diagram of address twister 216 which generates the IS95 interleaving sequence according to a preferred embodiment of the present invention. Address twister 216 preferably generates a nine-bit address 514 which is used to address the 384 bits of encoded data 142 in data buffer 202. Address twister 216 preferably generates nine-bit addresses 514 in the same sequence as the IS95 interleaving sequence shown in FIG. 4.

Address twister 216 includes two counters: a three-bit modulo-six counter 502 and a six-bit modulo-64 counter 506. A clock 504 is connected to counters 502 and 506. The count of three-bit counter 502 is incremented with each pulse of clock 504. However, the count of six-bit counter 506 is incremented by the pulses of clock 504 only when the count of three-bit counter 502 is equal to five. In other words, six-bit counter 506 is enabled only when the count of three-bit counter 502 is equal to five (i.e., "101" in binary).

Three-bit counter 502 repetitively generates the sequence zero through five. Each pulse of clock 504 increments the count of three-bit counter 502. When the count of three-bit counter 502 is five, a decoder 512 enables a synchronous clear input 510 of three-bit counter 502. When synchronous clear input 510 is enabled, the next pulse of clock 504 resets three-bit counter 502 (i.e. sets the count to zero). The structure and operation of decoder 512 will be apparent to persons skilled in the art based on the discussion contained herein. When three-bit counter 502 is reset, decoder 512 disables synchronous clear input 510, such that the next pulse of clock 504 increments the count of three-bit counter 502 (i.e. the count is incremented to one).

The count of three-bit counter 502 is represented by bit positions Q0 through Q2, where Q0 is the least significant bit position and Q2 is the most significant bit position. Bit positions Q0 through Q2 correspond to bits b6 through b8 of nine-bit address 514, respectively.

Six-bit counter 506 repetitively generates a sequence from zero through 63. When the count of six-bit counter 506 is 63, the next pulse of clock 504 causes the count of six-bit counter 506 to rollover to zero. The count of six-bit counter 506 is incremented by the pulses of clock 504 only when the count of three-bit counter 502 is equal to five. When the count of three-bit counter 502 is five, decoder 512 enables an enable input 508 of six-bit counter 506. The next pulse of clock 504 increments six-bit counter 506 and resets three-bit counter 502, as discussed above. When three-bit counter 502 is reset, decoder 512 deactivates enable input 508. Pulses of clock 504 do not increment six-bit counter 506 again until the count of three-bit counter 502 is again five. In other words, six-bit counter 506 is incremented every sixth pulse of clock 504.

The count of six-bit counter 506 is represented by bit positions D0 through D5, where D0 is the least significant bit and D5 is the most significant bit. D0 through D5 of six-bit counter 506 correspond to bits b5 through b0 of nine-bit address 514, respectively.

Initially, the count of three-bit counter 502 and six-bit counter 506 are reset to zero. Since all bit positions of counters 502 and 506 are reset, nine-bit address 514 is equal to zero, which is the first address in the IS95 interleaving sequence. The next pulse of clock 504 increments three-bit counter 502 which sets Q0 of three-bit counter 502 to a value of one. Since Q0 of three-bit counter 502 is b6 of nine-bit address 514, nine-bit address 514 is equal to 64, which is the second address in the IS95 interleaving sequence. As discussed above, six-bit counter 506 is not enabled until the count of three-bit counter 502 is five. The next pulse of clock 504 again increments three-bit counter 502, which resets Q0 and sets Q1 of three-bit counter 502. Since Q1 of three-bit counter 502 is b7 of nine-bit address 514, nine-bit address 514 is equal to 128, which is the third address in the IS95 interleaving sequence. This process continues until the count of three-bit counter 502 is five (Q0 and Q2 are set, Q1 is reset). As three-bit counter 502 increments to five, addresses 192, 256 and 320 are generated, which are the fourth, fifth and sixth addresses in the IS95 interleaving sequence, respectively.

When the count of three-bit counter 502 is five, synchronous clear input 510 and enable input 508 are enabled by decoder 512. The next pulse of clock 504 resets three-bit counter 502 and increments six-bit counter 506. At this point, D0 of six-bit counter 506 is set to a value of one and all other bit positions of counters 502 and 506 are reset to zero. D0 corresponds to b5 of nine-bit address 514. Thus, nine-bit address 514 is equal to 32, which is the seventh address in the IS95 interleaving sequence. When three-bit counter 502 is cleared, decoder 512 disables synchronous clear input 510 and enable input 508. Thus, the next pulse of clock 504 increments three-bit counter 502, but does not increment six-bit counter 506. At this point, Q0 of three-bit counter 502 and D0 of six-bit counter 506 are set. These outputs correspond to b5 and b6 of nine-bit address 514, respectively. Thus, nine-bit address 514 is equal to 96, which is the eighth address in the IS95 interleaving sequence.

The above described process continues until the count of six-bit counter 506 is 63 and the count of three-bit counter 502 is five, which corresponds to address 383, the last address in the IS95 interleaving sequence.

The next pulse of clock 504 resets three-bit counter 502, and 6-bit counter 506 rolls-over to a count of zero. At this point, Q0 through Q2 of three-bit counter 502 and D0 through D5 of six-bit counter are all reset and nine-bit address 514 is equal to 0, which is the first address in the IS95 interleaving sequence.

FIG. 6 illustrates the operation of address twister 216. In a step 602, three-bit counter 502 and six-bit counter 506 are reset to zero. In a decisional step 604, the count of three-bit counter 502 is compared to five.

If the count of three-bit counter 502 is five, then six-bit counter 506 is incremented and three-bit counter 502 is reset in steps 608 and. 610, respectively. In a step 612, Q0 through Q2 of three-bit counter 502 are output to b6 through b8 of nine-bit address 5 14, respectively. In a step 614, D0 through D5 of six-bit counter 506 are output to b5 through b0 of nine-bit address 514, respectively.

If the count of three-bit counter is not five in decisional step 604, then in a step 606 the count of three-bit counter 502 is incremented. In a step 612, Q0 through Q2 of three-bit counter 502 are output to b6 through b8 of nine-bit address 514, respectively. In a step 614, D0 through D5 of six-bit counter 506 are output to b5 through b0 of nine-bit address 514, respectively.

The above cycle continuously repeats starting at decisional step 604.

While the invention has been particularly shown and described with reference to several preferred embodiments thereof, it will be understood by those skilled in the art that various changes in form and details may be made therein without departing from the spirit and scope of the invention as defined in the appended claims. For example, different interleaving schemes and different block lengths can be implemented using the concept of multiple counter to create non-contiguous addresses as described herein.

What is claimed is:

1. An apparatus for interweaving data, comprising:
    a buffer to store the data;
    a contiguous counter to generate a contiguous sequence of addresses, the contiguous sequence being used to load the data into said buffer in a contiguous order; and
    an address twister to generate a non-contiguous sequence of the addresses, the non-contiguous sequence being used to output the data from said buffer in a noncontiguous wherein said non-contiguous sequence corresponds to an interweaving science, the address twister comprises a pair of counters, and each address in the non-contiguous sequence is formed by combining the outputs of the pair of counters.

2. The apparatus of claim 1, wherein said pair of counters are a three-bit modulo-six counter and a six-bit modulo-64 counter.

3. The apparatus of claim 2, wherein said address twister further comprises a means for enabling said six-bit modulo-64 counter only when the count of said three-bit modulo-six counter is five.

4. An apparatus for generating an interleaving sequence, comprising:

a three-bit counter which repetitively generates a count from 0 to five, said three-bit counter having bit positions Q0–Q2 with Q0 being the least significant bit and Q2 being the most significant bit;

a six-bit counter which repetitively generates a count from 0 to 63, said six-bit counter having bit positions D0–D5 with D0 being the least significant bit and D5 being the most significant bit;

a clock coupled to said three-bit counter and said six-bit counter;

means for enabling said six-bit counter only when the count of said three-bit counter is five; and means for outputting a nine-bit address, wherein said Q0–Q2 of said three-bit counter correspond to bits b6–b8 of said nine-bit address, respectively, and said D0–D5 of said six-bit counter correspond to bits b5–b0 of said nine-bit address, respectively, b0 being the least significant bit of the nine-bit address and b8 being the most significant bit of the nine-bit address.

5. The apparatus of claim 4, wherein said means for enabling said six-bit counter comprises a decoder with an input coupled to an output of said three-bit counter and an output coupled to an enable input of said six-bit counter.

6. The apparatus of claim 5, wherein said decoder enables said enable input of said six-bit counter when said output of said three-bit counter is equal to 5.

7. A mobile communication system, wherein the mobile communication system uses error encoding and interleaving to reduce error rates due to burst errors, comprising:

a base station; and a mobile station;

wherein a first interleaver in said mobile station interleaves a first set of data prior to transmission from the mobile station and a second interleaver in said base station interleaves a second set of data prior to transmission from the base station, each interleaver comprising:

a buffer to store one of the first and second sets of data;

a contiguous counter to generate a contiguous sequence of addresses, the contiguous sequence being used to load one of the first and second sets of data into said buffer in a contiguous order; and an address twister to generate a non-contiguous sequence of the addresses, the non-contiguous sequence being used to output one of the first and second sets of data from said buffer in a non-contiguous order, wherein said non-contiguous sequence corresponds to an interleaving sequence, the address twister comprises a pair of counters, and each address in the non-contiguous sequence is formed by combining the outputs of the pair of counters.

8. The apparatus of claim 7, wherein said address twister comprises:

a three-bit modulo-six counter; and six-bit modulo-64 counter.

9. The apparatus of claim 8, wherein said address twister further comprises:

a means for enabling said six-bit modulo-64 counter only when a count of said three-bit modulo-six counter is five.

* * * * *